US012700460B2

(12) United States Patent
Bai et al.

(10) Patent No.: US 12,700,460 B2
(45) Date of Patent: Aug. 4, 2026

(54) SFGT STORAGE ARRAY, STORAGE CHIP AND DATA-READING METHOD

(71) Applicant: XI'AN UNIIC SEMICONDUCTORS CO., LTD., Xi'an (CN)

(72) Inventors: Fujun Bai, Xi'an (CN); Bing Yu, Xi'an (CN); Shanzhen Zhao, Xi'an (CN)

(73) Assignee: XI'AN UNIIC SEMICONDUCTORS CO., LTD., Xi'an (CN)

( * ) Notice: Subject to any disclaimer, the term of this patent is extended or adjusted under 35 U.S.C. 154(b) by 268 days.

(21) Appl. No.: 18/588,007

(22) Filed: Feb. 27, 2024

(65) Prior Publication Data

US 2024/0203510 A1 Jun. 20, 2024

Related U.S. Application Data

(63) Continuation of application No. PCT/CN2022/115267, filed on Aug. 26, 2022.

(30) Foreign Application Priority Data

Aug. 27, 2021 (CN) .......................... 202110995088.5
Aug. 27, 2021 (CN) .......................... 202110996511.3

(51) Int. Cl.
*G11C 16/26* (2006.01)
*G11C 16/08* (2006.01)
*G11C 16/24* (2006.01)

(52) U.S. Cl.
CPC .............. *G11C 16/26* (2013.01); *G11C 16/08* (2013.01); *G11C 16/24* (2013.01)

(58) Field of Classification Search
CPC .......... G11C 16/26; G11C 16/24; G11C 16/08

(Continued)

(56) References Cited

U.S. PATENT DOCUMENTS

2006/0267076 A1* 11/2006 Sudo ..................... G11C 16/28
257/E21.691
2015/0303207 A1 10/2015 Liu et al.
(Continued)

FOREIGN PATENT DOCUMENTS

CN 103972238 A 8/2014
CN 104078078 A * 10/2014
(Continued)

OTHER PUBLICATIONS

CN104078078 English translation (Year: 2014).*
International Search Report, International Application No. PCT/CN2022/115267, mailed Nov. 30, 2022 (14 pages).

*Primary Examiner* — Sung Il Cho

(57) ABSTRACT

The present application provides an SFGT storage array, a storage chip, and a data-reading method. The SFGT storage array includes a true semi-floating gate array, a reference semi-floating gate array and a sense amplifier. The true semi-floating gate array includes a plurality of true semi-floating gate storage units, a plurality of first bit lines and a plurality of first word lines. Each of the plurality of first bit lines and each of the plurality of first word lines intersect to operate on one of the true semi-floating gate storage units. Each of the plurality of first bit lines is connected to a first input end of the sense amplifier. The reference semi-floating gate array includes a plurality of second bit lines. Each of the plurality of second bit lines is connected to a second input end of the sense amplifier.

17 Claims, 5 Drawing Sheets

(58) Field of Classification Search
USPC .......................................................... 365/191
See application file for complete search history.

(56)                        References Cited

U.S. PATENT DOCUMENTS

| 2020/0126615 | A1 | | 4/2020 | Lei et al. | |
|---|---|---|---|---|---|
| 2020/0293467 | A1 | * | 9/2020 | Ma | ...................... G06F 13/4291 |
| 2021/0313000 | A1 | * | 10/2021 | Shan | ......................... G11C 5/04 |
| 2021/0366528 | A1 | * | 11/2021 | Li | ...................... G06F 12/1441 |

FOREIGN PATENT DOCUMENTS

| CN | 104681053 | A | 6/2015 |
|---|---|---|---|
| CN | 106971372 | A | 7/2017 |

* cited by examiner

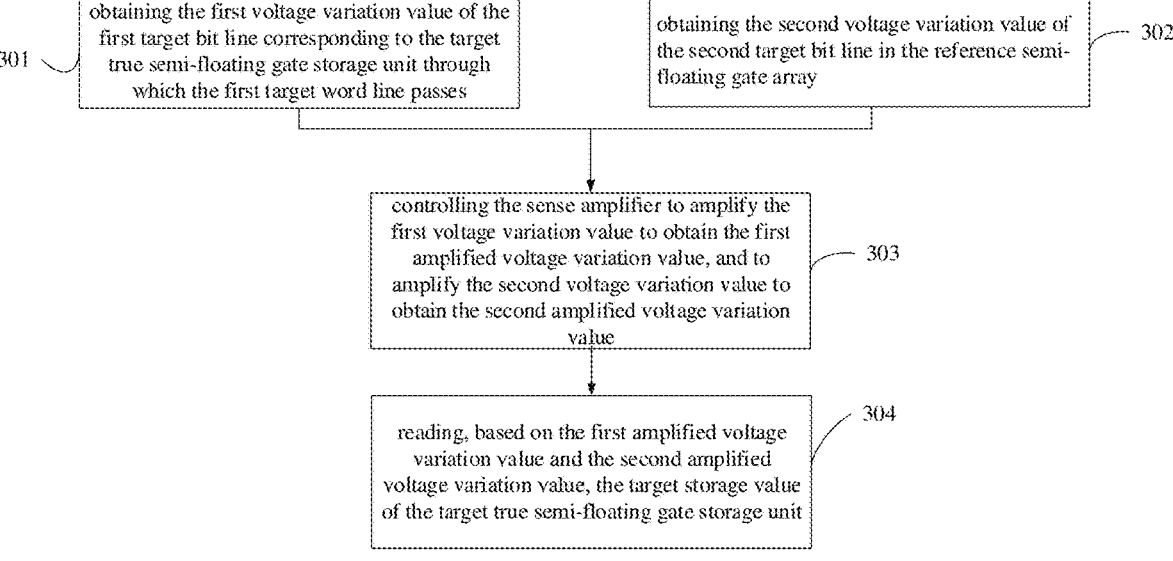

301 — obtaining the first voltage variation value of the first target bit line corresponding to the target true semi-floating gate storage unit through which the first target word line passes obtaining the second voltage variation value of the second target bit line in the reference semi-floating gate array — 302 controlling the sense amplifier to amplify the first voltage variation value to obtain the first amplified voltage variation value, and to amplify the second voltage variation value to obtain the second amplified voltage variation value — 303 reading, based on the first amplified voltage variation value and the second amplified voltage variation value, the target storage value of the target true semi-floating gate storage unit — 304

Fig. 3

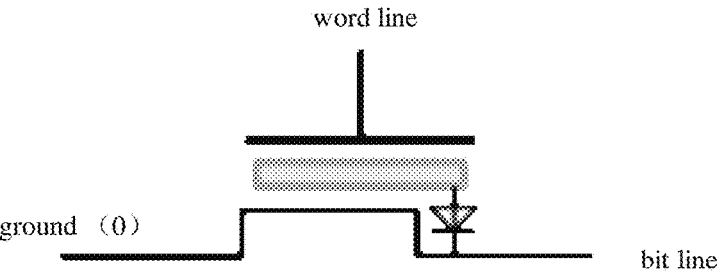

word line ground (0)

bit line

Fig. 4

SFGT STORAGE ARRAY, STORAGE CHIP AND DATA-READING METHOD

CROSS REFERENCE TO RELATED APPLICATIONS

This application is a continuation of International Patent Application No. PCT/CN2022/115267, filed Aug. 26, 2022, which claims priority to Chinese Patent Application No. 202110995088.5, filed Aug. 27, 2021 and to Chinese Patent Application No. 202110996511.3, filed Aug. 27, 2021, which are herein incorporated by reference in their entireties.

TECHNICAL FIELD

The present disclosure relates to a technical field of storages, and more particularly to an SFGT storage array, a storage chip and a data-reading method.

BACKGROUND

A semi-floating gate transistor (SFGT) is a transistor between a metal-oxide-semiconductor field-effect transistor (MOSFET) and a floating gate transistor (FGT). The SFGT may be configured to store data by applying different voltages to a word line and a bit line. The SFGT may be integrated into a storage array, which may then enable storage of huge volumes of data.

In the related art, when accessing data stored in a storage unit in an SFGT storage array, the bit line of the SFGT storage array is relatively long, thus the signal read out from the storage unit is relatively weak, which renders the process of reading the data more time-consuming, and the efficiency of data reading is relatively low.

SUMMARY OF THE DISCLOSURE

According to a first aspect of the present disclosure, an SFGT storage array is provided in the present disclosure. The SFGT storage array includes a true semi-floating gate array, a reference semi-floating gate array and a sense amplifier. The true semi-floating gate array includes a plurality of true semi-floating gate storage units, a plurality of first bit lines and a plurality of first word lines. Each of the plurality of first bit lines intersects with each of the plurality of first word lines for performing operation on one of the plurality of true semi-floating gate storage units. Each of the plurality of first bit lines is connected to a first input end of the sense amplifier. Each of the plurality of true semi-floating gate storage units is located at an intersection position of one of the plurality of first bit lines and one of the plurality of first word lines. The reference semi-floating gate array includes a plurality of second bit lines. Each of the plurality of second bit lines is connected to a second input end of the sense amplifier.

In some embodiments, the reference semi-floating gate array includes a plurality of reference semi-floating gate storage units and a reference word line. Each of the plurality of second bit lines intersects with the reference word line for performing operation on one of the plurality of reference semi-floating gate storage units. Each of the reference semi-floating gate storage unit is located at an intersection position of one of the plurality of second bit lines and the reference word line.

In some embodiments, the true semi-floating gate array, the reference semi-floating gate array and the sense amplifier correspond to each other one-by-one.

In some embodiments, the plurality of first bit lines in the true semi-floating gate array may drive to a first reference semi-floating gate array and a second reference semi-floating gate array on either side of the true semi-floating gate array respectively.

In some embodiments, the true semi-floating gate array may correspond to the first reference semi-floating gate array and the second reference semi-floating gate array. The ones numbered as odd serial numbers of the plurality of first bit lines included in the true semi-floating gate array are connected to a first input end of the first sense amplifier. The ones numbered as even serial numbers of the plurality of first bit lines included in the true semi-floating gate array are connected to a first input end of a second sense amplifier. Each of a plurality of second bit lines included in the first reference semi-floating gate array is connected to a second input end of the first sense amplifier. Each of a plurality of second bit lines included in the second reference semi-floating gate array is connected to a second input end of the second sense amplifier.

According to a second aspect of the present disclosure, a storage chip is provided. The storage chip includes: an SFGT storage array, a column-decoding module, a row-decoding module, and a logic control module. The logic control module may be connected to the SFGT storage array via the column-decoding module and the row-decoding module respectively, and configured to perform writing or reading operation on the SFGT storage array on a page-by-page basis based on the access instructions. The SFGT storage array includes a true semi-floating gate array, a reference semi-floating gate array and a sense amplifier. The true semi-floating gate array includes a plurality of true semi-floating gate storage units, a plurality of first bit lines and a plurality of first word lines. Each of the plurality of first bit lines intersects with each of the plurality of first word lines for performing operation on one of the plurality of true semi-floating gate storage units. Each of the plurality of first bit lines is connected to a first input end of the sense amplifier. Each of the plurality of true semi-floating gate storage units is located at an intersection position of one of the plurality of first bit lines and one of the plurality of first word lines. The reference semi-floating gate array includes a plurality of second bit lines. Each of the plurality of second bit lines is connected to a second input end of the sense amplifier.

In some embodiments, the storage chip further includes a circuit module. The circuit module is connected to each of the column-decoding module, the row-decoding module and the logic control module. The circuit module is configured to supply voltages for the column-decoding module, the row-decoding module and the logic control module.

In some embodiments, the storage chip further includes a data transmission path. The data transmission path is connected to the column-decoding module and the logic control module.

In some embodiments, the storage chip further includes an address input interface. The address input interface is connected to the row-decoding module and the logic control module.

In some embodiments, the storage chip further includes a command input interface. The command input interface is connected to the logic control module.

In some embodiments, the storage chip further includes a data input/output interface. The data input/output interface is connected to the data transmission path.

According to a third aspect of the present disclosure, a data-reading method performed by an SFGT storage array is provided. The SFGT storage array includes a true semi-floating gate array, a reference semi-floating gate array and a sense amplifier. The method includes: obtaining a first voltage variation value of a first target bit line corresponding to a target true semi-floating gate storage unit through which the first target word line passes, wherein the first target word line is one of a plurality of first word lines included in the true semi-floating gate array; obtaining a second voltage variation value of a second target bit line in the reference semi-floating gate array; controlling the sense amplifier to amplify the first voltage variation value and obtain a first amplified voltage variation value, and to amplify the second voltage variation value and obtain a second amplified voltage variation value; reading a target storage value of the target true semi-floating gate storage unit, based on the first amplified voltage variation value and the second amplified voltage variation value.

In some embodiments, the operation of obtaining the second voltage variation value of the second target bit line in the reference semi-floating gate array includes: obtaining the second voltage variation value of the second target bit line corresponding to a reference semi-floating gate storage unit through which a reference word line in the reference semi-floating gate array passes.

In some embodiments, before the operation of obtaining the first voltage variation value of the first target bit line corresponding to the target true semi-floating gate storage unit through which the first target word line passes, the method further includes: receiving a data-reading instruction; selecting, based on the data-reading instruction, the first target word line and a reference word line. The operation of obtaining the first voltage variation value of the first target bit line corresponding to the target true semi-floating gate storage unit through which the first target word line passes includes: after a preset time interval, obtaining the first voltage variation value of the first target bit line corresponding to the target true semi-floating gate storage unit through which the first target word line passes.

In some embodiments, the operation of obtaining the second voltage variation value of the second target bit line in the reference semi-floating gate array includes: obtaining a preset second voltage variation value from the sense amplifier connected to the second target bit line.

In some embodiments, the operation of reading, based on the first amplified voltage variation value and the second amplified voltage variation value, the target storage value of the target true semi-floating gate storage unit includes: in response to the first amplified voltage variation value being greater than the second amplified voltage variation value, reading the target storage value of the target true semi-floating gate storage unit as a first storage value; and in response to the first amplified voltage variation value being less than the second amplified voltage variation value, reading the target storage value of the target true semi-floating gate storage unit as a second storage value. The first storage value is different from the second storage value.

BRIEF DESCRIPTION OF THE DRAWINGS

In order to more clearly illustrate technical schemes in the present disclosure, the accompanying drawings required in the description of the embodiments will be briefly introduced below. Obviously, the drawings in the following description are only some embodiments of the present disclosure. For those of ordinary skills in the art, other drawings could be obtained based on these drawings without creative efforts.

FIG. 3 is a flowchart of a data-reading method according to an embodiment of the present disclosure.

FIG. 4 is a schematic diagram of an SFGT according to an embodiment of the present disclosure.

DETAILED DESCRIPTION

Figure 1:
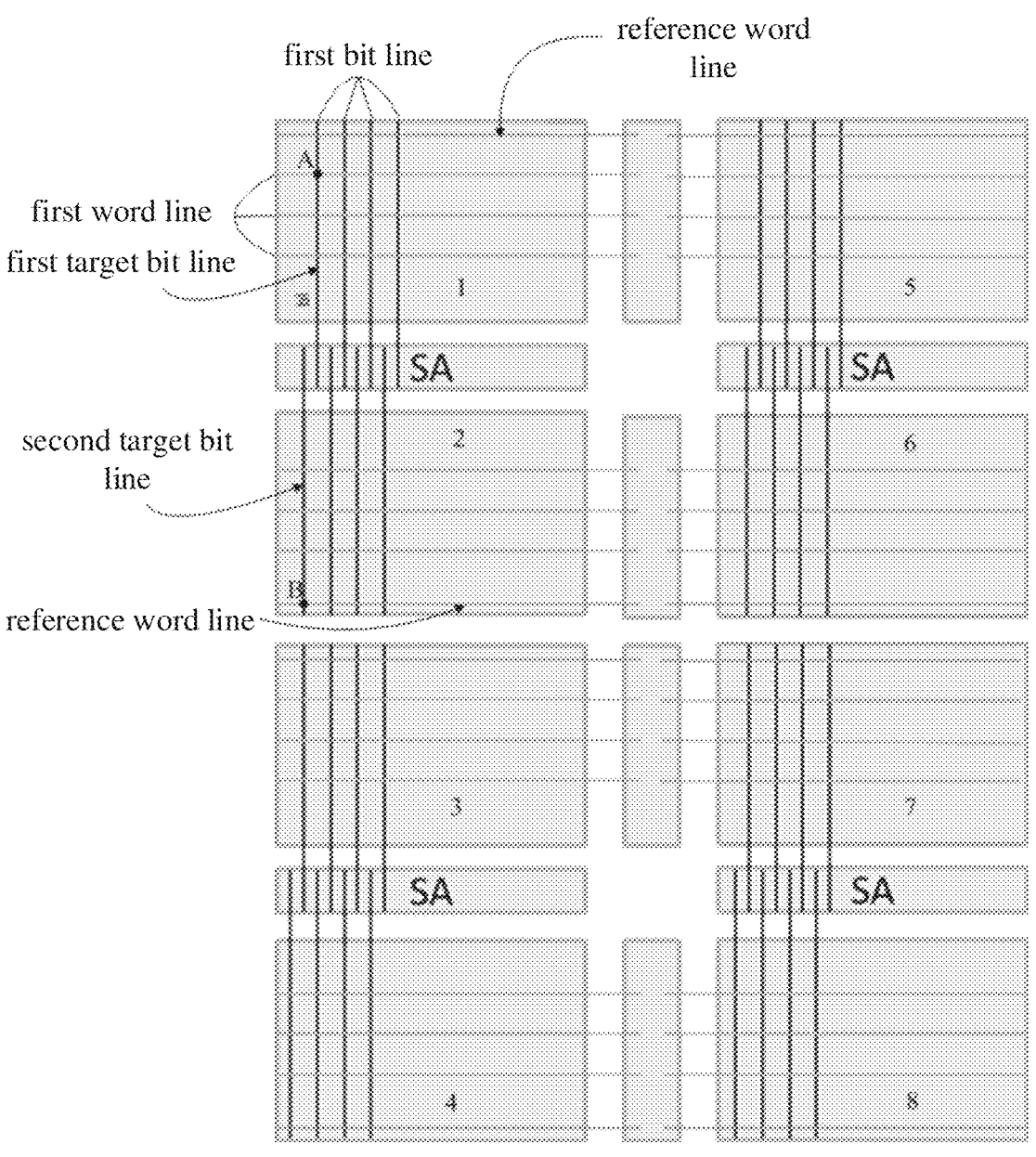
FIG. 1 is a schematic diagram of an SFGT storage array according to an embodiment of the present disclosure.

For a better understanding of the technical schemes provided by the embodiments of the present specification, the technical schemes of the embodiments of the present specification are described in detail below with the aid of the accompanying drawings as well as specific embodiments. It should be appreciated that, the embodiments in the present specification and the specific features in the embodiments are detailed descriptions of the technical schemes of the embodiments in the present specification, and are not limitations on the technical schemes in the present specification. The embodiments in this specification and the technical features in the embodiments may be combined with each other when being without conflict.

In the present context, relational terms such as "first" and "second" are employed merely to distinguish one entity or operation from another without necessarily requiring or implying actual existence of any such relationship or order between those entities or operations. Further, the terms "including", "comprising", or any other variations thereof are intended to cover non-exclusive inclusion, such that a process, a method, an article or a device comprising a serial of elements includes not only those elements, but also other elements not expressly listed, or elements inherent to such a process, a method, an article or a device. Without further limitation, an element preceded by the statement "including a/an . . . " does not preclude the existence of another identical element in the process, method, article or apparatus that includes that element. The term "more than two" includes the cases of two or more than two.

An SFGT storage array is provided in the present disclosure. The SFGT storage array includes a true semi-floating gate array, a reference semi-floating gate array and a sense amplifier.

The true semi-floating gate array may include a plurality of true semi-floating gate storage units, a plurality of first bit lines and a plurality of first word lines. Each of the plurality of first bit lines intersects with each of the plurality of first word lines, so as to perform operation on one of the plurality of true semi-floating gate storage units. Each of the plurality of first bit lines is connected to the first input end of the sense amplifier. Each of the plurality of true semi-floating gate storage units is located at the intersection position of a first bit line and a first word line.

The reference semi-floating gate array may include a plurality of second bit lines. Each of the plurality of second bit lines is connected to a second input end of the sense amplifier.

In a specific embodiment, the SFGT storage array may include the true semi-floating gate array, the reference semi-floating gate array and the sense amplifier.

The true semi-floating gate array may include the plurality of true semi-floating gate storage units, the plurality of first bit lines and the plurality of first word lines. Each of the plurality of first bit lines and each of the plurality of first word lines intersect to form one of the plurality of true semi-floating gate storage units. Each of the plurality of first bit lines may be configured to intersect each of the plurality of first word lines, so as to perform operation on one of the plurality of true semi-floating gate storage units. Each of the plurality of first bit lines is connected to the first input end of the sense amplifier. A true semi-floating gate storage unit may be located at the intersection position of a first bit line and a first word line.

The reference semi-floating gate array may include a plurality of second bit lines. Each of the plurality of second bit lines may be connected to a second input end of the sense amplifier. In this way, each of the plurality of first bit lines included in the true semi-floating gate array is connected to the first input end of the sense amplifier, and each of the plurality of second bit lines included in the reference semi-floating gate array is connected to the second input end of the sense amplifier. In other words, when the data stored in the storage unit of the SFGT storage array is read out, a signal read out from the storage unit may be amplified by the sense amplifier. In this way, a time consumption of the data-reading process may be reduced, and a data-reading efficiency may be enhanced.

In some embodiments, the reference semi-floating gate array may include a plurality of reference semi-floating gate storage units and a reference word line. Each of the plurality of second bit lines intersects with the reference word line, so as to perform operations on a reference semi-floating gate storage unit. The reference semi-floating gate storage unit is located at an intersection position of one of the second bit lines and the reference word line.

In a specific embodiment, the reference semi-floating gate array may include the plurality of reference semi-floating gate storage units and the reference word line. Each of the plurality of second bit lines may be configured to intersect the reference word line, so as to perform operation on the reference semi-floating gate storage unit. The reference semi-floating gate storage unit may be located at the intersection position of one of the second bit lines and the reference word line.

In some embodiments, the true semi-floating gate array, the reference semi-floating gate array and the sense amplifier correspond to each other one-by-one.

In some embodiments, the true semi-floating gate array, the reference semi-floating gate array and the sense amplifier correspond to each other one-by-one. A schematic diagram of an SFGT storage array is illustrated in FIG. 1. In FIG. 1, a total of 8 regions are illustrated, and the 8 regions are numbered as 1, 2, 3, 4, 5, 6, 7 and 8 respectively. In the present embodiment, the two regions that are numbered as 1 and 2 respectively are illustrated as examples.

The region numbered as 1 or region 1 may be a true semi-floating gate array. The region numbered as 2 or region 2 may be a reference semi-floating gate array. In the true semi-floating gate array, each of the four vertical straight lines is a first bit line, and each of the three horizontal straight lines is a first word line. The four vertical first bit lines intersect the three horizontal first word lines to form 12 true semi-floating gate storage units A. Each of the four vertical first bit lines is connected to a first input end of a sense amplifier (SA).

In the reference semi-floating gate array, each of the four vertical straight lines is a second bit line. The horizontal straight line located at the bottom of the reference semi-floating gate array is a reference word line. The four vertical second bit lines intersect the horizontal reference word line to form 4 reference semi-floating gate storage units B. Each of the four vertical second bit lines is connected to a second input end of the SA.

In some embodiments, the true semi-floating gate array and the reference semi-floating gate array are inter-convertible. For example, in FIG. 1, the region actually numbered as 2 may also include three horizontal word lines. If one of the three horizontal word lines in the region 1 is selected by the user, then the region 1 is the true semi-floating gate array, and the region 2 is the reference semi-floating gate array. If one of the three horizontal word lines in the region 2 is selected by the user, then the region 2 is the true semi-floating gate array, and the region 1 is the reference semi-floating gate array at this time. In other words, the region where the word line selected by the user is located is the true semi-floating gate array. The region with which this true semi-floating gate array are connected to either of the two input ends of the same SA is the reference semi-floating gate array.

In some embodiments, the true semi-floating gate array may correspond to a first reference semi-floating gate array and a second reference semi-floating gate array.

The ones numbered as odd serial numbers of the plurality of first bit lines included in the true semi-floating gate array are connected to a first input end of the first sense amplifier. The ones numbered as even serial numbers of the plurality of first bit lines included in the true semi-floating gate array are connected to a first input end of the second sense amplifier.

Each of the plurality of second bit lines included in the first reference semi-floating gate array is connected to a second input end of the first sense amplifier.

Each of the plurality of second bit lines included in the second reference semi-floating gate array is connected to a second input end of the second sense amplifier.

Figure 2:
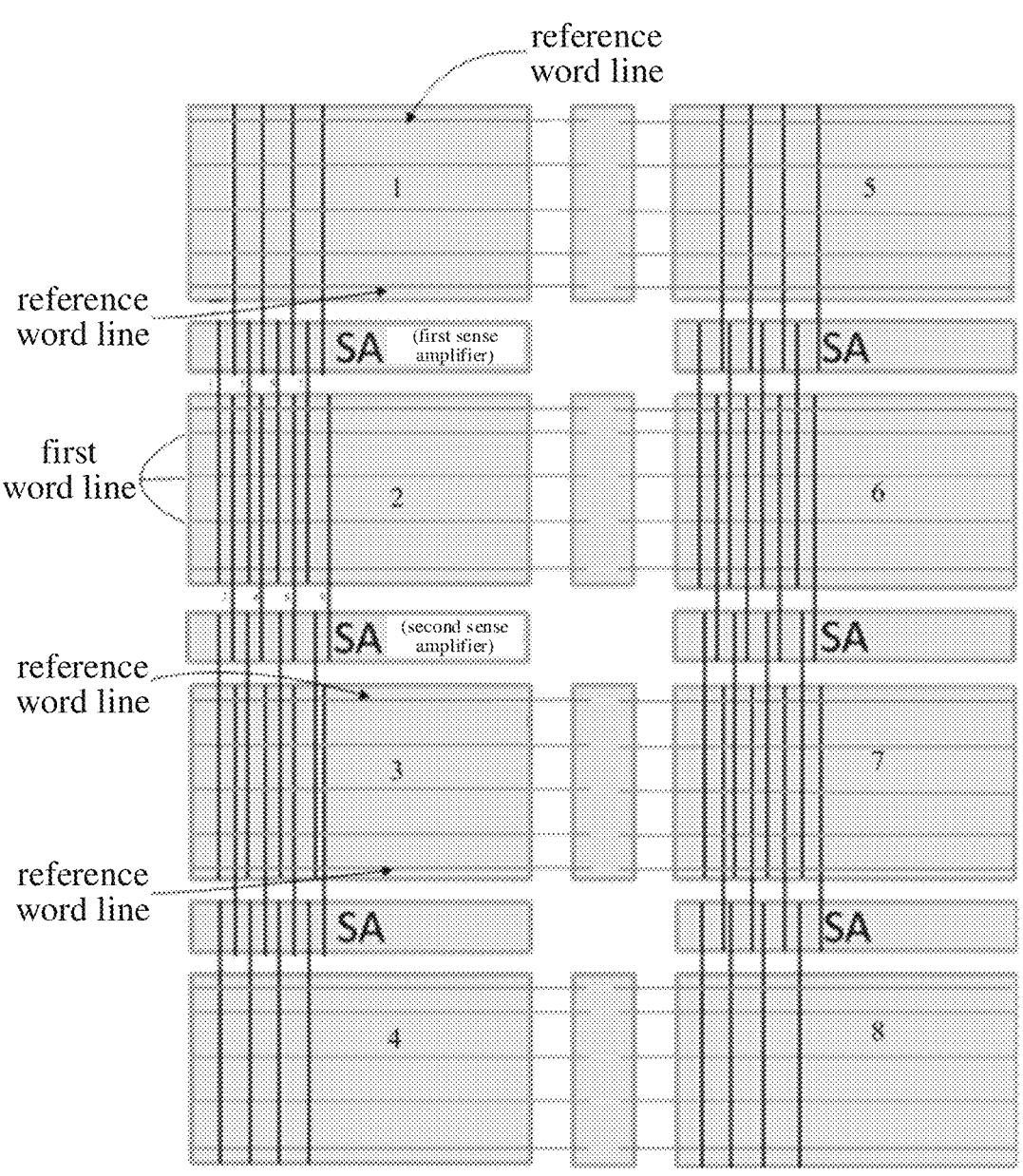
FIG. 2 is a schematic diagram of another SFGT storage array according to an embodiment of the present disclosure.

In some embodiments, the true semi-floating gate array may correspond to a first reference semi-floating gate array and a second reference semi-floating gate array. A schematic diagram of another SFGT storage array is illustrated in FIG. 2. In FIG. 2, a total of 8 regions are illustrated, and are numbered as 1, 2, 3, 4, 5, 6, 7 and 8 respectively. In the present embodiment, three regions that are numbered as 1, 2 and 3 respectively are illustrated as examples. As illustrated in FIG. 2, the region numbered as 2 or region 2 may be the true semi-floating gate array. The region numbered as 1 or region 1 may be the first reference semi-floating gate array. The region numbered as 3 or region 3 may be the second reference semi-floating gate array.

In the true semi-floating gate array, each of the 8 vertical straight lines is the first bit line, and each of the three horizontal straight lines is the first word line. 24 true semi-floating gate storage units exist at the intersection positions of the 8 vertical first bit lines and the three horizontal first word lines. The ones numbered as odd serial numbers of the plurality of first bit lines included in the true semi-floating gate array are connected to a first input end of the first sense amplifier. For example, the first bit lines numbered as 1, 3, 5 and 7 of the 8 first bit lines included in the true semi-floating gate array are connected to the first input end of the first sense amplifier. The ones numbered as even serial numbers of the plurality of first bit lines included in the true semi-floating gate array are connected to a first input end of the second sense amplifier. For example, the first bit lines numbered as 2, 4, 6 and 8 of the 8 first bit lines included in the true semi-floating gate array are connected to the first input end of the second sense amplifier.

In the first reference semi-floating gate array, each of the four vertical straight lines is a second bit line. The two horizontal straight lines located at the top and bottom of the first reference semi-floating gate array respectively are the reference word lines. 8 reference semi-floating gate storage units exist at the intersection positions of the four vertical second bit lines and the two horizontal reference word lines. Each of the plurality of second bit lines included in the first reference semi-floating gate array is connected to a second input end of the first sense amplifier. In other words, each of the 4 second bit lines included in the first reference semi-floating gate array is connected to the second input end of the first sense amplifier.

In the second reference semi-floating gate array, each of 4 ones of 8 vertical straight lines is a second bit line, and the two horizontal straight lines located at the top and bottom of the second reference semi-floating gate array respectively are the reference word lines. 8 reference semi-floating gate storage units exist at the intersection positions of the 4 vertical second bit lines and the two horizontal reference word lines. Each of the plurality of second bit lines included in the second reference semi-floating gate array is connected to the second input end of the second sense amplifier. In other words, the 4 second bit lines included in the second reference semi-floating gate array are connected to the second input end of the second sense amplifier. In this way, the plurality of first bit lines included in the true semi-floating gate array may be divided into odd-numbered first bit lines and even-numbered first bit lines. The odd-numbered first bit lines may drive to the first reference semi-floating gate array on one side of the true semi-floating gate array, and the even-numbered first bit lines may drive to the second reference semi-floating gate array on another side of the true semi-floating gate array. The odd-numbered and even-numbered first bit lines are sensed by the two SAs respectively, to amplify the stored data.

In the SFGT storage array illustrated in FIG. 2, the true semi-floating gate array and the reference semi-floating gate arrays are inter-convertible. For example, in FIG. 2, the region numbered as 3 may also include three horizontal word lines. If one of the three horizontal word lines in region 2 is selected by the user, then the region 2 is the true semi-floating gate array. At this time, the region 1 is the first reference semi-floating gate array, and the region 3 is the second reference semi-floating gate array. If one of the three horizontal word lines in the region 3 is selected by the user, then the region 3 is the true semi-floating gate array. At this time, the region 2 is the first reference semi-floating gate array, and the region 4 is the second reference semi-floating gate array. In other words, the region where the word line selected by the user is located is the true semi-floating gate array. The two regions that are adjacent to and located above and below this true semi-floating gate array are the first reference semi-floating gate array and the second reference semi-floating gate array respectively.

In the related art, when accessing data stored in a storage unit in an SFGT storage array, the bit line of the SFGT storage array is relatively long, thus the signal read out from the storage unit is relatively weak, which causes the data-reading process to be more time-consuming, and the efficiency of data reading to be relatively low.

In the present disclosure, each of the plurality of first bit lines included in the true semi-floating gate array is connected to the first input end of the sense amplifier, and each of the plurality of second bit lines included in the reference semi-floating gate array is connected to the second input end of the sense amplifier. In other words, when the data stored in the storage unit of the SFGT storage array is read out, the signal read out from the storage unit may be amplified by the sense amplifier. In this way, the time consumption of the data-reading process may be reduced, and the data-reading efficiency may be enhanced.

As may be observed from the above-mentioned technical schemes, the embodiments of the present disclosure provide the SFGT storage array. The SFGT storage array includes the true semi-floating gate array, the reference semi-floating gate array and the sense amplifier. The true semi-floating gate array includes a plurality of true semi-floating gate storage units, a plurality of first bit lines and a plurality of first word lines. Each of the plurality of first bit lines intersects with each of the plurality of first word lines, so as to perform operation on the true semi-floating gate storage unit. Each of the plurality of first bit lines is connected to the first input end of the sense amplifier. The true semi-floating gate storage unit is located at the intersection position of the first bit line and the first word line. The reference semi-floating gate array includes the plurality of second bit lines. Each of the plurality of second bit lines is connected to the second input end of the sense amplifier. In this way, each of the plurality of first bit lines included in the true semi-floating gate array is connected to the first input end of the sense amplifier, and each of the plurality of second bit lines included in the reference semi-floating gate array is connected to the second input end of the sense amplifier. In other words, when the data stored in the storage unit of the SFGT storage array is read out, the signal read out from the storage unit may be amplified by the sense amplifier. In this way, the time consumption of the data-reading process may be reduced, and the data-reading efficiency may be enhanced.

As illustrated in FIG. 3, FIG. 3 is a flowchart of a data-reading method according to the present disclosure. The method is performed by the SFGT storage array in the above-mentioned embodiments. The method includes operations at blocks illustrated in FIG. 3.

At block 301: obtaining a first voltage variation value of a first target bit line corresponding to a target true semi-floating gate storage unit through which the first target word line passes. The first target word line is one of the plurality of first word lines included in the true semi-floating gate array.

At block 302: obtaining a second voltage variation value of a second target bit line in the reference semi-floating gate array.

At block 303: controlling the sense amplifier to amplify the first voltage variation value to obtain a first amplified voltage variation value, and to amplify the second voltage variation value to obtain a second amplified voltage variation value.

At block 304: reading, based on the first amplified voltage variation value and the second amplified voltage variation value, a target storage value of the target true semi-floating gate storage unit.

In some embodiments, in the operation at the block 301, the region number as 1 and the region numbered as 2 illustrated in FIG. 1 are illustrated as examples. The first voltage variation value of the first target bit line corresponding to the target true semi-floating gate storage unit through which the first target word line passes may be obtained. The first target word line is one of the plurality of first word lines included in the true semi-floating gate array. For example, the first voltage variation value of the first target bit line corresponding to the target true semi-floating gate storage unit A through which the first target word line passes may be obtained, and the first target word line is located at the topmost of the region 1. The first target word line is one of the 3 first word lines included in the true semi-floating gate array.

In some embodiments, in the operation at the block 302, the second voltage variation value of the second target bit line in the reference semi-floating gate array may also be obtained.

In some embodiments, in the operation at the block 302, the method further includes: obtaining the second voltage variation value of the second target bit line corresponding to a reference semi-floating gate storage unit through which the reference word line in the reference semi-floating gate array passes.

In some embodiments, in the operation at the block 302, the second voltage variation value of the second target bit line corresponding to a reference semi-floating gate storage unit through which the reference word line in the reference semi-floating gate array passes may also be obtained. For example, the second voltage variation value of the second target bit line corresponding to the reference semi-floating gate storage unit B through which the reference word line in the region numbered as 2 passes may also be obtained.

In some embodiments, in the operation at the block 302, the method further includes: obtaining a preset second voltage variation value from the sense amplifier connected to the second target bit line.

In some embodiments, in the operation at the block 303, the sense amplifier may be controlled to amplify the first voltage variation value to obtain the first amplified voltage variation value, and to amplify the second voltage variation value to obtain the second amplified voltage variation value.

In some embodiments, before the operation at the block 301, the method further includes: receiving a data-reading instruction; selecting, according to the data-reading instruction, the first target word line and the reference word line. The operation of obtaining the first voltage variation value of the first target bit line corresponding to the target true semi-floating gate storage unit through which the first target word line passes includes: after a preset time interval, obtaining the first voltage variation value of the first target bit line corresponding to the target true semi-floating gate storage unit through which the first target word line passes.

FIG. 4 is a schematic diagram of an SFGT. As illustrated in FIG. 4, the SFGT includes a word line, a bit line and a ground. The operating principle of the SFGT is that: the different voltages are applied to the word line and the bit line to perform different cell operations.

In some embodiments, the data-reading instruction may further be received. The first target word line located at the topmost of the region numbered as 1 and the reference word line in the region numbered as 2 may be further selected according to the data-reading instruction. In other words, the first target word line and the reference word line selected according to the address-decoding process may be turned on. After the first target word line is turned on, the current would flow to the ground via the SFGT. Then after a preset time interval, i.e., after a period of time of current discharge, the first voltage variation value of the first target bit line corresponding to the target true semi-floating gate storage unit A through which the first target word line passes may be obtained. In this way, the user may select the word line in the true semi-floating gate array according to his/her own requirements, and then the data in the target true semi-floating gate storage unit through which the word line passes may be read out. The implementation process is simple, convenient and swift.

According to $Q=I \times t=C \times V$, as the time progresses, $\Delta Q=I \times \Delta t=C \times \Delta V$. Therefore, after the preset time interval, i.e., after the period of time of current discharge, the sense amplifier may be controlled to amplify the first voltage variation value $\Delta V1$ of the first target bit line to obtain the first amplified voltage variation value, and to amplify the second voltage variation value $\Delta V2$ of the second target bit line to obtain the second amplified voltage variation value.

In some embodiments, in the operation at the block 304, the target storage value of the target true semi-floating gate storage unit may be read out based on the first amplified voltage variation value and the second amplified voltage variation value.

Since the capacitance value C1 of the first target bit line is identical to the capacitance value C2 of the second target bit line, then a magnitude relationship between the current I1 flowing in the target true semi-floating gate storage unit and the current I2 flowing in the reference semi-floating gate storage unit may be derived based on a magnitude relationship between the first amplified voltage variation value and the second amplified voltage variation value. The target storage value in the target true semi-floating gate storage unit may further be determined based on the magnitude relationship between the current I1 and the current I2.

In some embodiments, in the operation at the block 304, the method further includes: in response to the first amplified voltage variation value being greater than the second amplified voltage variation value, reading the target storage value of the target true semi-floating gate storage unit as the first storage value; in response to the first amplified voltage variation value being less than the second amplified voltage variation value, reading the target storage value of the target true semi-floating gate storage unit as the second storage value wherein the first storage value is different from the second storage value.

In case where the first amplified voltage variation value is greater than the second amplified voltage variation value, it is indicated that, the current I1 flowing in the target true semi-floating gate storage unit is greater than the current I2 flowing in the reference semi-floating gate storage unit. At this point, the target storage value in the target true semi-floating gate storage unit may be read as the first storage value. For example, the first storage value may be 1.

In case where the first amplified voltage variation value is less than the second amplified voltage variation value, it is indicated that, the current I1 flowing in the target true semi-floating gate storage unit is less than the current I2 flowing in the reference semi-floating gate storage unit. At this point, the target storage value in the target true semi-floating gate storage unit may be read as the second storage value. The first storage value is different from the second storage value. For example, the second storage value may be 0. In this way, the target storage value of the target true semi-floating gate storage unit may be determined based on the magnitude relationship between the first amplified voltage variation value and the second amplified voltage variation value. In this way, the time consumption of the data-reading process may be reduced, and the data-reading efficiency may be enhanced.

After the target storage value of the target true semi-floating gate storage unit is read out, the voltages of all the bit lines in the SFGT storage array may be switched to a low potential. An erasing operation may be performed on the storage units of the selected SFGT storage array. The erasing operation is intended to restore the storage units in the SFGT storage array to an initial state, so as to facilitate subsequent data-writing process, i.e., a programming operation. The erasing operation may overwrite or clear the original data in the storage units. The storage units of the SFGT storage array after the erasing operation are in a holding state. The programming operation may be performed in the SFGT storage array after the erasing operation, which involves a process of writing the data in the sense amplifier to a selected storage unit.

Figure 5:
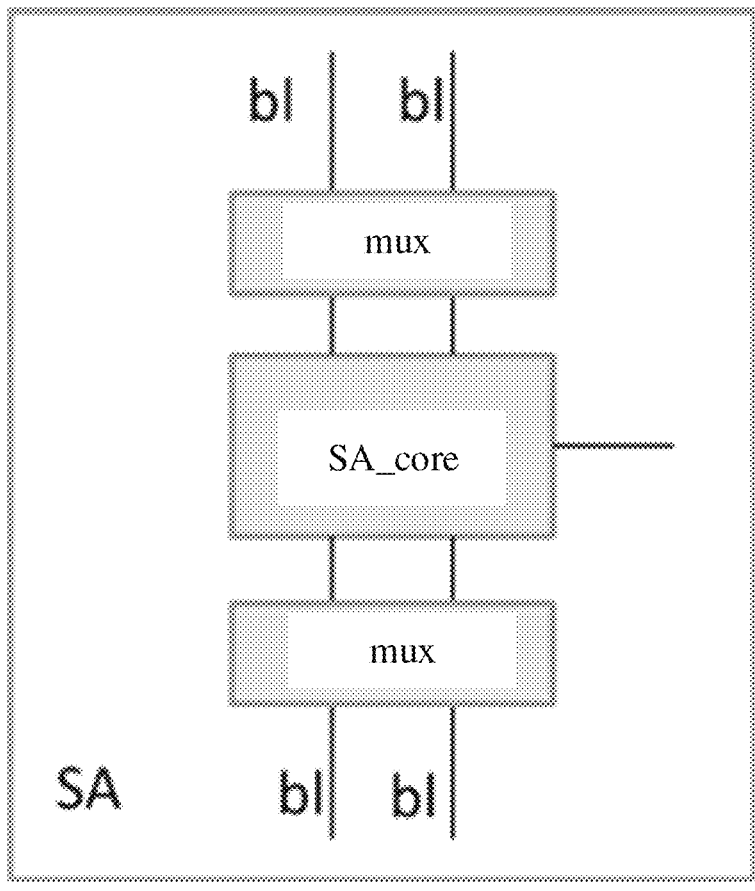
FIG. 5 is a schematic diagram of an internal structure of a sense amplifier according to an embodiment of the present disclosure.

FIG. 5 is a schematic diagram of an internal structure of the sense amplifier SA. An SA_core is an operating core of the SA. The primary function of the SA_core is to perform signal amplification. The multiplexer (MUX) on the other hand, may realizes the selectivity of the bit line. The bit line (bl) is also illustrated in FIG. 5.

In the related art, when accessing data stored in the storage unit in the SFGT storage array, the bit line of the SFGT storage array is relatively long, thus the signal read out from the storage unit is relatively weak, which renders the data-reading process more time-consuming, and the data-reading efficiency is relatively low.

In the present disclosure, the sense amplifier may be controlled to amplify the first voltage variation value of the first target bit line to obtain the first amplified voltage variation value, and to amplify the second voltage variation value of the second target bit line to obtain the second amplified voltage variation value. The target storage value of the target true semi-floating gate storage unit may further be read out based on the first amplified voltage variation value and the second amplified voltage variation value. In other words, when the data stored in the storage unit of the SFGT storage array is read, the signal read out from the storage unit may be amplified by the sense amplifier. In this way, the time consumption of the data-reading process may be reduced, and the data-reading efficiency may be enhanced.

As is evident from the above technical scheme, the data-reading method is provided in some embodiments of the present disclosure. The data-reading method includes: obtaining the first voltage variation value of the first target bit line corresponding to the target true semi-floating gate storage unit through which the first target word line passes, the first target word line being one of the plurality of first word lines included in the true semi-floating gate array; obtaining the second voltage variation value of the second target bit line in the reference semi-floating gate array; controlling the sense amplifier to amplify the first voltage variation value to obtain the first amplified voltage variation value, and to amplify the second voltage variation value to obtain the second amplified voltage variation value; reading, based on the first amplified voltage variation value and the second amplified voltage variation value, the target storage value of the target true semi-floating gate storage unit. In this way, the sense amplifier may be controlled to amplify the first voltage variation value of the first target bit line to obtain the first amplified voltage variation value, and to amplify the second voltage variation value of the second target bit line to obtain the second amplified voltage variation value. The target storage value of the target true semi-floating gate storage unit may further be read out based on the first amplified voltage variation value and the second amplified voltage variation value. In other words, when the data stored in the storage unit of the SFGT storage array is read out, the signal read out from the storage unit may be amplified by the sense amplifier. In this way, the time consumption of the data-reading process may be reduced, and the data-reading efficiency may be enhanced.

Figure 6:
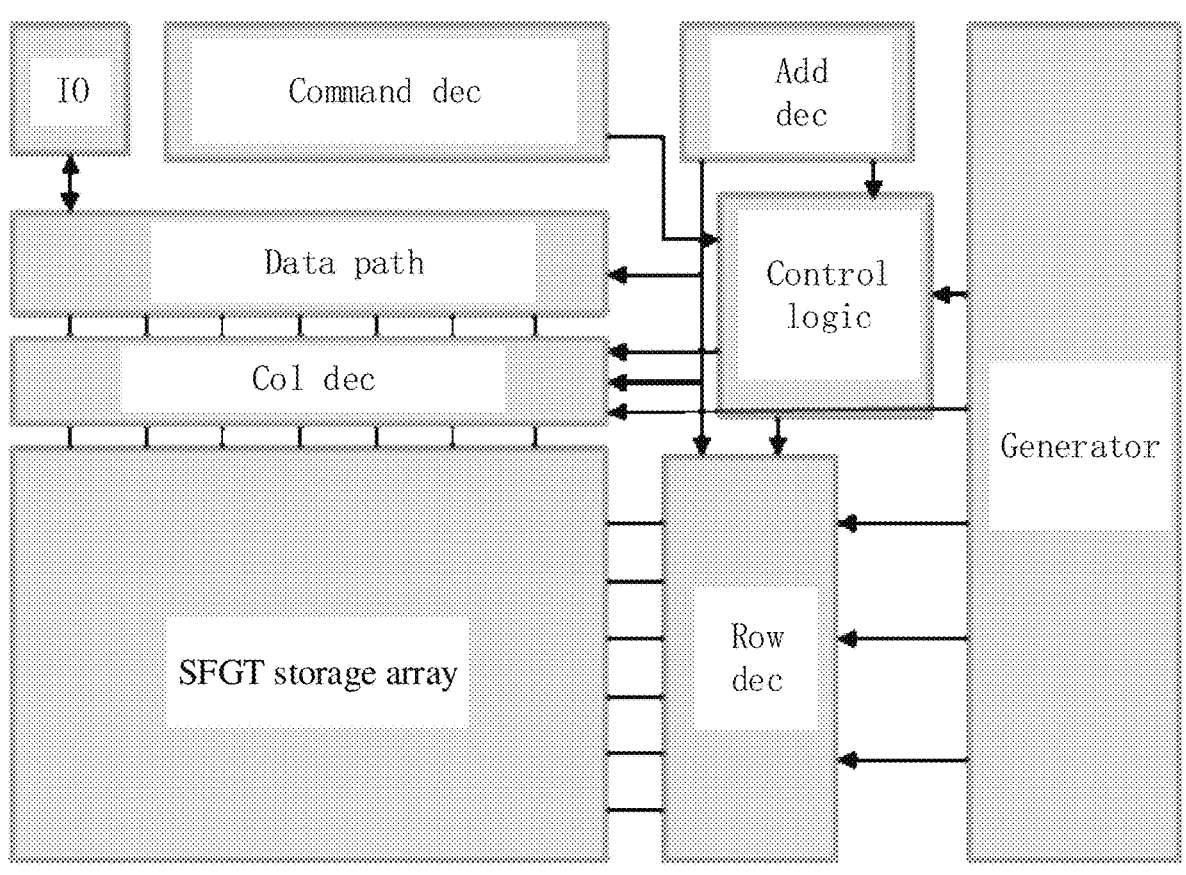
FIG. 6 is a schematic diagram of a storage chip according to an embodiment of the present disclosure.

As illustrated in FIG. 6, FIG. 6 is a schematic diagram of the storage chip according to the present disclosure. The storage chip may include: an SFGT storage array, a column-decoding module, a row-decoding module and a logic control module.

The logic control module may be connected to the SFGT storage array via the column-decoding module and the row-decoding module respectively, configured to perform writing and/or reading operation on the SFGT storage array on a page-by-page basis according to the access instructions;

The SFGT storage array includes the true semi-floating gate array, the reference semi-floating gate array and the sense amplifier.

The true semi-floating gate array includes a plurality of true semi-floating gate storage units, the plurality of first bit lines and the plurality of first word lines. Each of the plurality of first bit lines intersects with each of the plurality of first word lines, so as to perform operation on the true semi-floating gate storage unit. Each of the plurality of first bit lines is connected to the first input end of the sense amplifier. The true semi-floating gate storage unit is located at the intersection position of a first bit line and a first word line.

The reference semi-floating gate array includes a plurality of second bit lines. Each of the plurality of second bit lines is connected to the second input end of the sense amplifier.

The SFGT storage array in the present embodiment may adopt the SFGT storage array of the embodiment as illustrated in any of FIGS. 1-6.

As illustrated in FIG. 6, the storage chip may include the SFGT storage array, the column-decoding module (Col_dec), the row-decoding module (Row_dec), and the logic control module (Control logic). The logic control module may be connected to the SFGT storage array via the column-decoding module and the row-decoding module respectively, configured to perform writing and/or reading operation the SFGT storage array on a page-by-page basis according to the access instructions. The structure of the SFGT storage array has been described in detail in the preceding embodiments, and will not be elaborated herein.

In some embodiments, the storage chip further includes a circuit module. The circuit module is connected to each of the column-decoding module, the row-decoding module and the logic control module. The circuit module is configured to supply voltages for the column-decoding module, the row-decoding module and the logic control module.

As illustrated in FIG. 6, the storage chip may further include the circuit module (Generator). The circuit module may be connected to the column-decoding module, the row-decoding module and the logic control module. The circuit module is configured to supply voltages for the column-decoding module, the row-decoding module and the logic control module. The generator module supplies a variety of operating voltages for the storage chip.

In some embodiments, the storage chip further includes a data transmission path. The data transmission path is connected to the column-decoding module and the logic control module.

As illustrated in FIG. 6, the storage chip may further include the data transmission path (Data path). The data transmission path may be connected to the column-decoding module and the logic control module.

In some embodiments, the storage chip further includes an address input interface. The address input interface is connected to the row-decoding module and the logic control module.

As illustrated in FIG. 6, the storage chip may further include the address input interface (Add dec). The address input interface may be connected to the row-decoding module and the logic control module.

In some embodiments, the storage chip further includes a command input interface. The command input interface is connected to the logic control module.

As illustrated in FIG. 6, the storage chip further includes the command input interface (Command dec). The command input interface may be connected to the logic control module.

In some embodiments, the storage chip further includes a data input/output interface. The data input/output interface is connected to the data transmission path.

As illustrated in FIG. 6, the storage chip may further include the data input/output interface (TO). The data input/output interface may be connected to the data transmission path.

Figure 7:
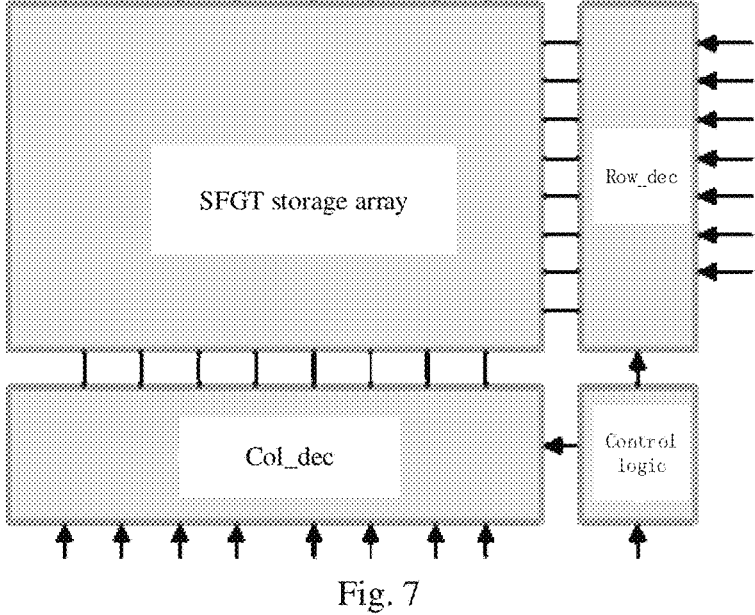
FIG. 7 is a schematic diagram of a memory core according to an embodiment of the present disclosure.

The control logic is an operating control center of the storage chip. The control logic is primarily configured to provide a variety of logic and voltages to a core of the storage chip. FIG. 7 is a schematic diagram of the core unit of the storage chip. The core unit includes the row-decoding module (Row_dec), the column-decoding module (Col_dec) and the logic control module (Control logic). The logic control module is configured to generate control signals for various timings. Modules such as the word line driver and SA are included in the SFGT cell array. The word line driver is primarily configured to provide driving capability, enabling the word line at the most distant end to have a signal that is not too faint. The primary function of the SA is to amplify small signals to a full voltage swing. The Row_dec is the row-decoding module, configured to select a word line corresponding to the input address, and then initiate the data-reading operation. The Col_dec is the column-decoding module, configured to decode an input column address.

As is evident from the above technical scheme, the storage chip is provided in some embodiments of the present disclosure. The signal read out from the storage unit may be amplified by the storage chip through the sense amplifier. In this way, the time consumption of the data-reading process may be reduced, and the data-reading efficiency may be enhanced.

As described above, the above-mentioned embodiments are merely for illustrating the technical scheme of the present disclosure, but not for restricting the same. Although the present disclosure has been described in detail with reference to the aforementioned embodiments, those of ordinary skills in the art should appreciate that, the technical schemes documented in the above-mentioned embodiments may still be modified or some of the technical features therein may be equivalently substituted; and such modifications or substitutions would not render the essence of the corresponding technical schemes departing from the spirit and scope of the technical schemes according to the embodiments of the present disclosure.

What is claimed is:

1. An SFGT storage array, comprising a true semi-floating gate array, a reference semi-floating gate array and a sense amplifier, wherein the true semi-floating gate array comprises a plurality of true semi-floating gate storage units, a plurality of first bit lines and a plurality of first word lines, each of the plurality of first bit lines intersects with each of the plurality of first word lines for performing operation on one of the plurality of true semi-floating gate storage units, each of the plurality of first bit lines is connected to a first input end of the sense amplifier, each of the plurality of true semi-floating gate storage units is located at an intersection position of one of the plurality of first bit lines and one of the plurality of first word lines;

the reference semi-floating gate array comprises a plurality of second bit lines, each of the plurality of second bit lines is connected to a second input end of the sense amplifier; and the reference semi-floating gate array comprises a plurality of reference semi-floating gate storage units and a reference word line, each of the plurality of second bit lines intersects with the reference word line for performing operation on one of the plurality of reference semi-floating gate storage units, each of the reference semi-floating gate storage unit is located at an intersection position of one of the plurality of second bit lines and the reference word line.

2. The SFGT storage array as claimed in claim 1, wherein the true semi-floating gate array, the reference semi-floating gate array and the sense amplifier correspond each other one-by-one.

3. The SFGT storage array as claimed in claim 1, wherein the plurality of first bit lines in the true semi-floating gate array drive to a first reference semi-floating gate array and a second reference semi-floating gate array on either side of the true semi-floating gate array respectively.

4. The SFGT storage array as claimed in claim 3, wherein the true semi-floating gate array corresponds to the first reference semi-floating gate array and the second reference semi-floating gate array;

the ones numbered as odd serial numbers of the plurality of first bit lines comprised in the true semi-floating gate array are connected to a first input end of a first sense amplifier, the ones numbered as even serial numbers of the plurality of first bit lines comprised in the true semi-floating gate array are connected to a first input end of a second sense amplifier;

each of a plurality of second bit lines comprised in the first reference semi-floating gate array is connected to a second input end of the first sense amplifier; and each of a plurality of second bit lines comprised in the second reference semi-floating gate array is connected to a second input end of the second sense amplifier.

5. A storage chip, comprising:

an SFGT storage array, a column-decoding module, a row-decoding module and a logic control module;

the logic control module is connected to the SFGT storage array via the column-decoding module and the row-decoding module respectively, and is configured to perform writing and/or reading operation on the SFGT storage array on a page-by-page basis based on an access instruction;

the SFGT storage array comprises a true semi-floating gate array, a reference semi-floating gate array and a sense amplifier;

the true semi-floating gate array comprises a plurality of true semi-floating gate storage units, a plurality of first bit lines and a plurality of first word lines, each of the plurality of first bit lines intersects with each of the plurality of first word lines for performing operation on one of the plurality of true semi-floating gate storage units, each of the plurality of first bit lines is connected to a first input end of the sense amplifier, each of the plurality of true semi-floating gate storage units is located at an intersection position of one of the plurality of first bit lines and one of the plurality of first word line, and the reference semi-floating gate array comprises a plurality of second bit lines, each of the plurality of second bit lines is connected to a second input end of the sense amplifier, the reference semi-floating gate array comprises a plurality of reference semi-floating gate storage units and a reference word line, each of the plurality of second bit lines intersects with the reference word line for performing operation on one of the plurality of reference semi-floating gate storage units, each of the reference semi-floating gate storage unit is located at an intersection position of one of the plurality of second bit lines and the reference word line.

6. The storage chip as claimed in claim 5, further comprising:

a circuit module, connected to the column-decoding module, the row-decoding module and the logic control module, and configured to supply voltages for the column-decoding module, the row-decoding module and the logic control module.

7. The storage chip as claimed in claim 5, further comprising:

a data transmission path, connected to the column-decoding module and the logic control module.

8. The storage chip as claimed in claim 5, further comprising:

an address input interface, connected to the row-decoding module and the logic control module.

9. The storage chip as claimed in claim 5, further comprising:

a command input interface, connected to the logic control module.

10. The storage chip as claimed in claim 7, further comprising:

a data input/output interface, connected to the data transmission path.

11. The storage chip as claimed in claim 5, wherein the true semi-floating gate array, the reference semi-floating gate array and the sense amplifier correspond each other one-by-one.

12. A data-reading method performed by an SFGT storage array comprising a true semi-floating gate array, a reference semi-floating gate array and a sense amplifier, wherein the reference semi-floating gate array comprises a plurality of reference semi-floating gate storage units and a reference word line, each of the plurality of second bit lines intersects with the reference word line for performing operation on one of the plurality of reference semi-floating gate storage units, each of the reference semi-floating gate storage unit is located at an intersection position of one of the plurality of second bit lines and the reference word line, the method comprises:

obtaining a first voltage variation value of a first target bit line corresponding to a target true semi-floating gate storage unit through which a first target word line passes, the first target word line being one of a plurality of first word lines comprised in the true semi-floating gate array;

obtaining a second voltage variation value of a second target bit line in the reference semi-floating gate array;

controlling the sense amplifier to amplify the first voltage variation value and obtain a first amplified voltage variation value, and to amplify the second voltage variation value to obtain a second amplified voltage variation value; and reading, based on the first amplified voltage variation value and the second amplified voltage variation value, a target storage value of the target true semi-floating gate storage unit.

13. The method as claimed in claim 12, wherein the operation of obtaining the second voltage variation value of the second target bit line in the reference semi-floating gate array comprises:

obtaining the second voltage variation value of the second target bit line corresponding to a reference semi-floating gate storage unit through which a reference word line in the reference semi-floating gate array passes.

14. The method as claimed in claim 12, wherein before the operation of obtaining the first voltage variation value of the first target bit line corresponding to the target true semi-floating gate storage unit through which the first target word line passes, the method further comprises:

receiving a data-reading instruction;

selecting, based on the data-reading instruction, the first target word line and a reference word line;

the operation of obtaining the first voltage variation value of the first target bit line corresponding to the target true semi-floating gate storage unit through which the first target word line passes comprises:

after a preset time interval, obtaining the first voltage variation value of the first target bit line corresponding to the target true semi-floating gate storage unit through which the first target word line passes.

15. The method as claimed in claim 12, wherein the operation of obtaining the second voltage variation value of the second target bit line in the reference semi-floating gate array comprises:

obtaining a preset second voltage variation value from the sense amplifier connected to the second target bit line.

16. The method as claimed in claim 12, wherein the operation of reading, based on the first amplified voltage variation value and the second amplified voltage variation value, the target storage value of the target true semi-floating gate storage unit comprises:

reading, in response to the first amplified voltage variation value being greater than the second amplified voltage variation value, the target storage value of the target true semi-floating gate storage unit as a first storage value;

reading, in response to the first amplified voltage variation value being less than the second amplified voltage variation value, the target storage value of the target true semi-floating gate storage unit as a second storage value; wherein the first storage value is different from the second storage value.

17. The method as claimed in claim 12, wherein the true semi-floating gate array, the reference semi-floating gate array and the sense amplifier correspond each other one-by-one.

* * * * *